United States Patent
Talbot et al.

(10) Patent No.: US 7,154,309 B1
(45) Date of Patent: Dec. 26, 2006

(54) DUAL-MODE OUTPUT DRIVER CONFIGURED FOR OUTPUTTING A SIGNAL ACCORDING TO EITHER A SELECTED HIGH VOLTAGE/LOW SPEED MODE OR A LOW VOLTAGE/HIGH SPEED MODE

(75) Inventors: Gerald Robert Talbot, Concord, MA (US); Randall Paul Biesterfeldt, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 22 days.

(21) Appl. No.: 11/033,754

(22) Filed: Jan. 13, 2005

(51) Int. Cl.
*H03K 3/00* (2006.01)

(52) U.S. Cl. .................. 327/108; 327/112; 327/318

(58) Field of Classification Search ........ 327/108–112, 327/318; 365/56, 91; 361/56, 91

See application file for complete search history.

(56) References Cited

U.S. PATENT DOCUMENTS 5,933,034 A * 8/1999 Hastings et al. ............ 327/108

OTHER PUBLICATIONS

"AMD-3181™ HyperTransport™ PCI-X® Tunnel Data Sheet", 24637 Rev. 3.02, Aug. 10, 2004, pp. 1-87.

* cited by examiner

*Primary Examiner*—Kenneth B. Wells
(74) *Attorney, Agent, or Firm*—Manelli Denison & Selter PLLC; Leon R. Turkevich

(57) ABSTRACT

An integrated circuit includes a dual mode output driver configured for outputting an output signal according to either a high voltage mode or a low voltage mode, and a controller for controlling the dual mode output driver at the selected mode. The dual mode output driver includes a high-voltage pull-up/pull-down driver circuit and a low-voltage pull-up/pull-down driver circuit, the low-voltage pull-down transistor in series with the high-voltage pull-down transistor that is coupled to the output node. Protection circuitry prevents the low-voltage transistors from encountering an overvoltage condition during the high voltage mode, and controls the slew rate of the output signal during the low voltage mode.

12 Claims, 2 Drawing Sheets

| Control Signal Input | High-Voltage Mode | Low-Voltage Mode |
|---|---|---|
| V_SEL | 1 (VDD=3.3V) | 0 (VDD=1.5V) |
| Data Inputs | P1, N2 | D1, D2 |
| D1 | (Don't Care) | (Data) |
| D2 | 0 | (Data) |
| N1 | 0 | 3.3V |
| N2 | (Data) | 3.3V |
| P1 | (Data) | 1.5V (OFF) |
| P2 | 0 | 3.3V |

DUAL-MODE OUTPUT DRIVER CONFIGURED FOR OUTPUTTING A SIGNAL ACCORDING TO EITHER A SELECTED HIGH VOLTAGE/LOW SPEED MODE OR A LOW VOLTAGE/HIGH SPEED MODE

BACKGROUND OF THE INVENTION

1. Field of the Invention

The present invention relates to driver circuits in digital systems for adjusting input impedance and output impedance of respective receivers and transmitters relative to a prescribed impedance of a transmission line.

2. Background Art

Newer processor architecture designs require transfer of data between large integrated circuits at higher speeds. For example, newer PCI bus devices implemented as host bridge devices need to be able to transfer data between a processor bus (i.e., a local bus) and an Input/Output (I/O) bus. For example, newer PCI host bridge devices may utilize HyperTransport™ technology, which specifies a data rate of 1.6 GHz between each differential signal pair. Hence, the newer PCI bus devices need to be implemented using newer semiconductor fabrication process technology to optimize the higher speed requirements of HyperTransport™ technology. Examples of newer semiconductor fabrication process technology involves using thin oxide device technology, where transistors have a device feature size of 0.13 microns, and a gate oxide thickness of 3 nm: such transistors utilize nominal supply voltages of 1.2 volts, and each of the factors of size, supply voltage, and speed must be scalable to provide a faster circuit that has a smaller size and requires less supply voltage.

Newer PCI specifications (e.g., PCI-X) also specify smaller voltage swings for bus signals relative to earlier PCI specifications. Hence, the newer PCI specifications are considered "low-voltage applications" (1.2 to 1.5V), and the earlier PCI specifications are considered "high-voltage applications" due to earlier process technologies utilizing thicker-oxide transistors having, for example, a device constructed to have a feature size of 0.35 microns, and a gate oxide thickness of 7.5 nm and configured for using a 3.3 V nominal supply voltage.

However, the PCI host bridge devices still need to be backwards-compatible with the high-voltage applications. Hence, problems arise in reduced voltage tolerances available due to scaling of process technologies to smaller device sizes, while maintaining voltage levels for the high-voltage applications. In particular, the external voltage swings (e.g., the voltage supply of VDD and VSS) for an integrated circuit) tend to scale lower as the process technologies result in smaller device sizes: as circuits operate faster, the corresponding voltage swing becomes smaller, and the transistors used to build the output drivers also scale to smaller sizes based on the process technology.

The requirements for backwards-compatability requires adding a second group of transistors, distinct from the first group of low-voltage transistors, that can tolerate the larger voltage requirements of the older PCI specifications. The second group of transistors have larger physical dimensions than the first group of low-voltage transistors, and can therefore withstand higher supply voltages. Hence, the thicker gate oxide transistors have a lower switching speed but can withstand a higher supply voltage.

In addition, backwards-compatability requires resolving the combined use of diode structures for Electro Static Discharge (ESD) protection for the first group of transistors with use of the second, larger group of transistors.

In addition, attempts to use thick oxide transistors for the low-voltage applications as well as the high-voltage applications suffers from the disadvantage that it is extremely difficult to obtain sufficient switching speed from the thick oxide transistors to meet the requirements of newer PCI specifications. In particular, the thick oxide transistors are larger structures have a higher capacitance in general, as well as source-drain capacitance; in addition, the higher voltages used in the thick oxide transistors need to transition over a wider voltage range, and the amount of available current to move the voltage through the capacitance is less. Hence, the thick oxide transistors are substantially slower than the thin oxide transistors.

Prior attempts at combining thick oxide transistors and thin oxide transistors on the same silicon substrate have suffered the disadvantage of sacrificing performance in either the high-voltage (low speed) application or the low-voltage (high speed) application; hence, prior attempts have not been able to provide a circuit able to provide optimal performance for both the high-voltage (low speed) application at 3.3V and the low-voltage (high speed) application at 1.5V.

SUMMARY OF THE INVENTION

There is a need for an arrangement that enables an integrated circuit to employ different operating voltage transistors on the same silicon substrate, forming an output buffer capable of switching between a high-speed, low voltage mode and a lower-speed, high voltage mode.

There also is a need for an arrangement that enables an integrated circuit to provide a circuit topology having fast switching transistors for fast switching according to newer PCI specifications, while providing protection for the fast switching transistors for high-voltage switching according to existing PCI specifications.

These and other needs are attained by the present invention, where an integrated circuit includes a dual mode output driver configured for outputting an output signal according to either a high voltage mode or a low voltage mode, and a controller for controlling the dual mode output driver at the selected mode. The dual mode output driver includes a high-voltage pull-up/pull-down driver circuit and a low-voltage pull-up/pull-down driver circuit, the low-voltage pull-down transistor in series with the high-voltage pull-down transistor that is coupled to the output node. Protection circuitry prevents the low-voltage transistors from encountering an overvoltage condition during the high voltage mode, and controls the slew rate of the output signal during the low voltage mode.

Hence, a single integrated circuit can be used for either a high-speed/low voltage mode for optimized transmission at higher speeds, or a low-speed/high voltage mode for optimized transmission at lower speeds in compliance with existing technologies.

One aspect of the present invention provides an integrated circuit having a controller and a dual mode output driver. The controller is configured for outputting configuration signals for one of a first voltage mode and a second voltage mode. The first voltage mode corresponds to outputting an output signal at a first voltage range and a first frequency, and the second voltage mode corresponds to outputting the output signal at a second voltage range and a second frequency, the first voltage range greater than the second voltage range and the second frequency substantially higher than the first frequency.

The dual mode output driver of the above-identified aspect is configured for selectively outputting the output signal at one of the first voltage mode and the second voltage mode in response to the configuration signals. The dual mode output driver includes a voltage source configured for outputting one of a first reference voltage for the first voltage range and a second reference voltage for the second voltage range in response to a first of the configuration signals. The dual mode output driver also includes a high-voltage pull-up transistor coupled to the voltage source and an output node for the output signal. The high-voltage pull-up transistor is configured for controlling a voltage rise of the output signal according to the first voltage mode in response to a second of the configuration signals. The dual mode output driver also includes a high-voltage pull-down transistor, coupled to the output node, and configured for controlling a voltage drop of the output signal according to the first voltage range in response to a third of the configuration signals.

The dual mode output driver also includes a low-voltage pull-up transistor, coupled to the voltage source, and configured for controlling a voltage rise of the output signal according to the second voltage mode in response to a first gate signal generated based on a fourth of the configuration signals. The dual mode output driver also includes a low-voltage pull-down transistor, coupled to a base reference voltage and the high-voltage pull-down transistor at a connecting node, and configured for controlling a voltage drop of the output signal according to the second voltage mode in response to a second gate signal generated based on a fifth of the configuration signals. The dual mode output driver also includes protection circuitry configured for protecting the low-voltage pull-up transistor and the low-voltage pull-down transistor from encountering an overvoltage condition during operation of the dual mode output driver in the first voltage mode.

Additional advantages and novel features of the invention will be set forth in part in the description which follows and in part will become apparent to those skilled in the art upon examination of the following or may be learned by practice of the invention. The advantages of the present invention may be realized and attained by means of instrumentalities and combinations particularly pointed in the appended claims.

BRIEF DESCRIPTION OF THE DRAWINGS

Reference is made to the attached drawings, wherein elements having the same reference numeral designations represent like element elements throughout and wherein.

BEST MODE FOR CARRYING OUT THE INVENTION

Figures 1, 3:
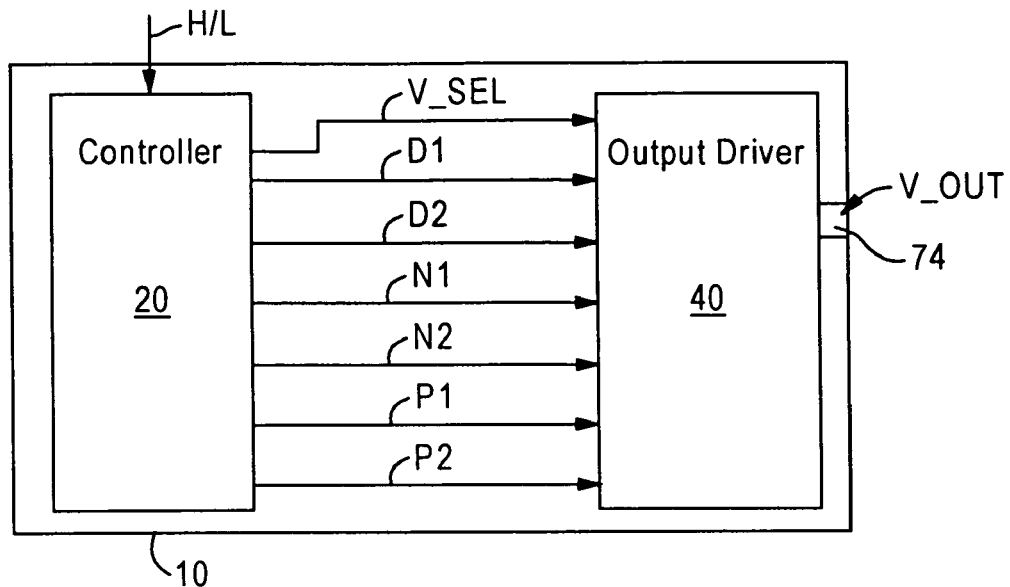
FIG. 1 is a block diagram illustrating an integrated circuit chip having a controller and a dual-voltage mode output driver, according to an embodiment of the present invention.
FIG. 3 is a diagram illustrating the control signals output by the controller of FIG. 1 in high voltage mode and low voltage mode.

FIG. 1 is a diagram illustrating an integrated circuit 10 that includes a controller 20 and a dual-mode CMOS output driver 40 configured for outputting a voltage signal (V_OUT) according to either a low voltage/high speed mode or a high voltage/low speed mode, for example based on an external configuration signal (H/L), according to an embodiment of the present invention. The output driver 40 for a single output signal (V_OUT) is illustrated for simplicity: in implementation each PCI output signal will have a corresponding output driver 40.

Figure 2:
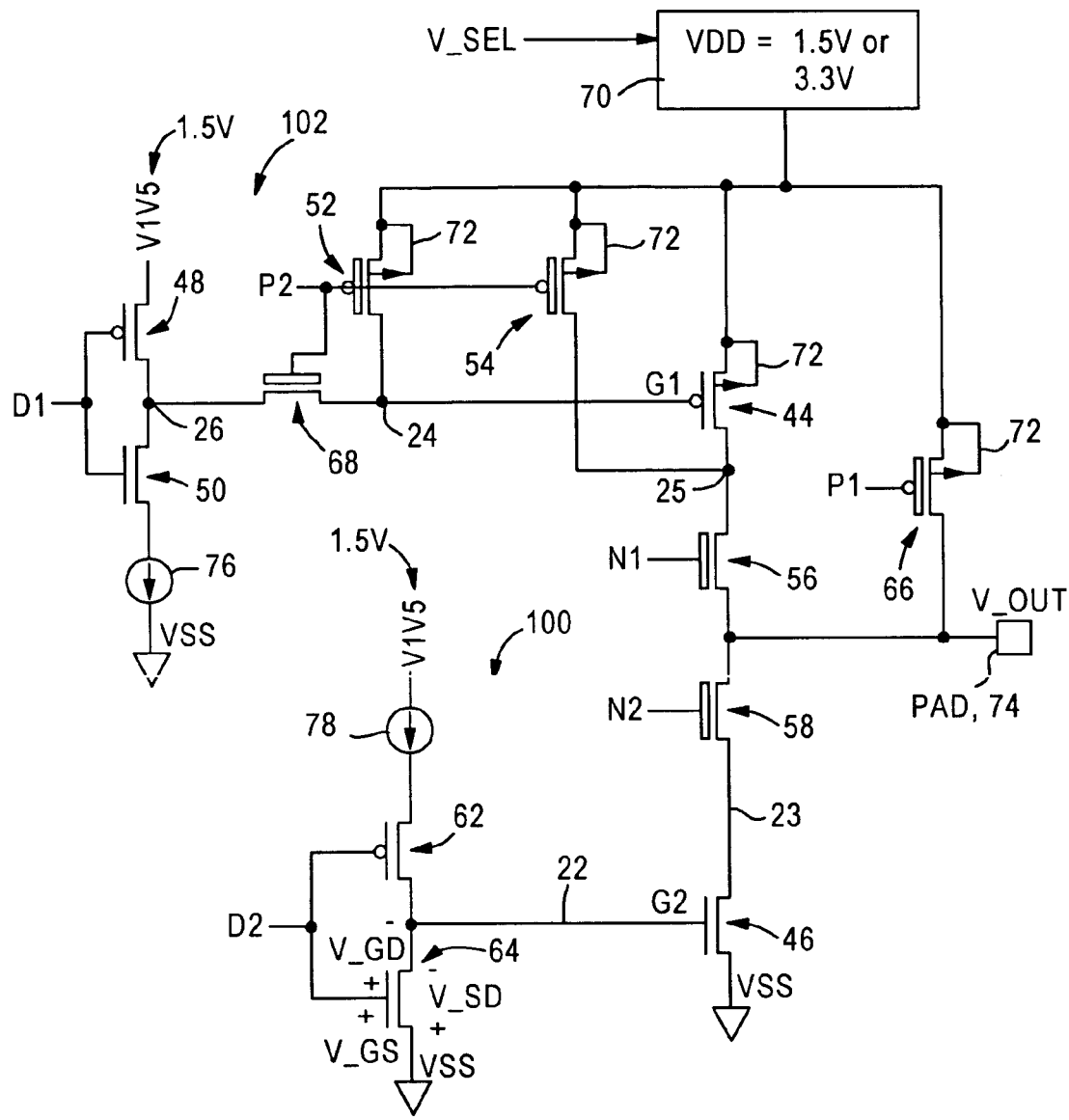
FIG. 2 is a diagram illustrating in detail the dual-voltage mode output driver of FIG. 1, according to an embodiment of the present invention.

FIG. 2 is a diagram illustrating the dual-mode output driver 40, according to an embodiment of the present invention. As described below, the output driver includes a high-voltage pull-up transistor 72 and a high-voltage pull-down transistor 58 for outputting the output signal (V_OUT) according to a prescribed high voltage range (e.g., 0V to 3.3V) for low speed transmissions (e.g., up to 133 Mbits/sec per wire of the bus). The output driver 40 also includes a low-voltage pull-up transistor 44 and a low-voltage pull-down transistor 46 for outputting the output signal (V_OUT) according to a prescribed low voltage range (e.g., 0V to 1.5V) for high-speed transmissions (e.g., above 133 Mbits/sec up to and including 533 Mbits/sec per wire of the bus). As described below, the output driver 40 also includes protection circuitry for protection of the low-voltage pull-up 44 transistor and the low-voltage pull-down transistor 46 during operation in the high-voltage mode.

Hence, the disclosed mixed voltage output buffer 40 enables the integrated circuit 10 to be implemented on PC board that can easily be utilized for either newer PCI specifications (e.g., PCI-X Mode 2) or older PCI specifications, based on the PC board being able to use the same form factor slot as used for older devices. Hence, the PC board can simply be added to an existing slot on, the PC motherboard.

The dual-mode output driver 40 includes low-voltage transistors 44, 46, 48, 50, 62, and 64, where "low-voltage" transistors are defined herein as transistors optimized for operating within a low voltage operating range (e.g., plus or minus 5 percent of the nominal operating voltage of VDD=1.2V, VSS=Ground), and which must be protected from a high voltage operating range (described below) to prevent damage. Hence, the low-voltage transistors are optimized for high-speed transmission (e.g., 266 Mbits/sec to 533 Mbits/sec) of signals at a low operating voltage of VDD=1.2V and VSS=Ground; as such, the "low-voltage" transistors are also referred to herein as "high-speed/low-voltage transistors".

The dual-mode output driver 40 also includes high-voltage transistors 52, 54, 56, 58, 66, and 68, each illustrated in FIG. 2 as having a thicker gate, where "high-voltage" transistors are defined herein as transistors optimized for operating within a high voltage operating range (e.g., plus or minus 5 percent of the nominal operating voltage of VDD=3.3V, VSS=Ground), the high voltage operating range substantially higher than the operating voltage of the high-speed/low voltage transistors. Hence, the high-voltage transistors are optimized for lower-speed transmission (e.g., up to 133 Mbits/sec) of signals at a frequency lower than the high-speed/low-voltage transistors.

The transistors 44, 48, 52, 54, 62, and 66 are P-channel transistors (i.e., P-FET or PMOS transistors), and the transistors 46, 50, 56, 58, 64, and 68 are N-channel transistors (i.e., N-FET or NMOS transistors). In addition, the high-voltage P-channel transistors 44, 52, 54, and 66 are implemented using an N-well fabrication process as illustrated by the line 72, where each of the transistors 44, 52, 54, and 66 resides within an N-well: the N-well has a higher or equal positive potential relative to the source and drain of the corresponding high-voltage P-channel transistor 44, 52, 54, or 66; hence, the N region of each high-voltage P-channel transistor is at a higher or equal potential than the two P regions, relative to the I/O voltage being applied by the VDD node.

As shown in FIG. 2, the voltage source (VDD) 70 is configured to be selectable at either 1.5V (i.e., low voltage mode) or 3.3V (i.e., high voltage mode). In addition, each of the voltage supplies V1V5 are set at 1.5V.

According to the disclosed embodiment, a general requirement is that any one of the low-voltage transistors 44, 46, 48, 50, 62, or 64 cannot have a gate-source voltage (V_GS), or a gate-drain voltage (V_GD), or a source-drain voltage (V_SD) of more than 1.5V (i.e, V_GS≦1.5V, V_GD≦1.5V, V_SD≦1.5V). Hence, use of the dual-mode output driver 40 requires the low-voltage transistors 44, 46, 48, 50, 62, and 64 to be protected from over-voltage when the dual-mode output driver 40 is used in high-voltage mode (i.e., when the voltage source is configured for supplying VDD=3.3V.

An additional concern is that is addressed by the disclosed embodiment is that the edge rates of low-voltage transistors 44, 46, 48, 50, 62, and 64 (i.e., the time for transitioning from logical 1 to 0, or vice versa) can exceed the edge rate capabilities of physical etch connection on a PC board in the case where the driver 40 is in high-speed mode; in particular, the physical etch connection (i.e., PC board trace) may not be configured for high-speed communications, as exemplified by the lack of any double-terminated features that provide matching impedance at both the transmitter and receiver, but rather may be limited to transmitting data signals up to 133 Mbits/sec.

Hence, the disclosed embodiment is configured for controlling the rate at which the analog voltage (V_OUT) changes on the output pad 74 (i.e., slew rate). As described below, the driver circuit 40 includes low-voltage based CMOS inverters 100 and 102 having respective current sources 77 and 76 configured for controlling the slew rate of the output signal on the pad 74. The controlled slew rate ensures that that electrical noise is avoided by limiting the edge rates of the low-voltage transistors 44, 46, 48, 50, 62, and 64 from exceeding the edge rate capabilities of the physical etch connection.

High Voltage Mode

The high-voltage mode will now be described. The controller 20 of FIG. 1 is configured for outputting the control signals D1, D2, P1, P2, N1, N2, and V_SEL in high voltage mode as illustrated in FIG. 3. In the high voltage mode, the driver circuit 40 is configured by the controller 20 as a CMOS inverter using the high-voltage transistors 66 and 58 and respective input signals P1, N2; in addition, in the high voltage mode the driver circuit 40 is configured to ensure that the low-voltage transistors 44, 46, 48, 50, 62, and 64 do not receive greater than the voltage limit of 1.5V across any of the source, gate, or drain.

Hence, in high-voltage mode, the controller outputs the voltage selection signal (V_SEL) to cause the voltage supply circuit 70 to output 3.3V (VDD=3.3V). The controller 20 also outputs the data on paths P1 and N2, where both paths P1 and N2 receive the same logical value; hence, if P1 and N2 are logical "1" (i.e., "High"), then the pull-up transistor 66 is turned off and the pull-down transistor 58 is turned on, forcing the output voltage V_OUT on the pad 74 (i.e., pad voltage) down to a logical "0" (i.e., "Low") at VSS (grounded at 0V), described below; if P1 and N2 are logical "0" (i.e., "Low"), then the pull-up transistor 66 is turned on and the pull-down transistor 58 is turned off, raising the pad voltage V_OUT on the pad 74 up to a logical "1" (i.e., "High") at 3.3V. The high-voltage transistors 58 and 66 are implemented as a typical 3.3V driver, hence there is no concern for edge rates since the process technology used to implement the transistors 58 and 66 is consistent with edge rate limitations of existing PC board traces.

The output driver 40 includes protection circuitry in the form of a low-voltage based CMOS inverter 100 for protecting the low-voltage pull-down transistor 46; the protection circuitry also includes a high-voltage transistor 56 for protection of the low-voltage pull-up transistor 44, as well as high-voltage transistors 52 and 54, described below.

The low-voltage based CMOS inverter 100 is configured for asserting the gate signal G2 for protection of the low-voltage pull-down transistor 46 in high voltage mode. In particular, the controller 20 outputs the control signal D2 to protect the transistor 46 from the pad voltage V_OUT (up to VDD=3.3V) which exceeds the voltage limit V_GS of 1.5 V. In particular, in high voltage mode the controller sets the voltage on the control signal D2 to a low value, causing the inverter 100 formed by transistors 62 and 64 and current source 78 to output onto node 22 a gate signal G2 having "high" voltage (e.g., G2=1.5V); the "high" voltage on the gate signal G2 turns on the transistor 46, causing the voltage at connecting node 23 to be clamped to VSS. Hence, even though transistor 58 is switched by the control signal N2 to be either a "High" or a "Low", in either state the node 23 will be VSS, protecting the transistor 46 by limiting the voltage V_DS of transistor 46 to less than the 1.5 V limit. As apparent from the foregoing, the resistance of the low-voltage transistors is controlled to ensure the source-drain voltage is less than 0.1 V when current is flowing through the transistor during switching. Hence, the transistor 46 effectively clamps the source of transistor 58 to ground, causing the drain of the high-voltage transistor 58 to switch between 0V and 3.3V in response to the corresponding gate input N2.

The controller 20 also configures the high-voltage transistor 54 to protect the source-drain voltage V_SD of the transistor 44, coupled to VDD=3.3V, from exceeding 1.5V when the pad voltage (V_OUT) is low (e.g., V_OUT=0). In particular, in high voltage mode the controller 20 sets the control signal N1 to zero volts (N1=0), turning off the transistor 56. Since the transistor 56 still may have leakage current, the controller 20 in high voltage mode also sets the control signal P2 to zero volts (P2=0), turning on transistors 52 and 54 and turning off transistor 68; hence, the nodes 24 and 25 each have a voltage of 3.3V due to transistors 52 and 54 being turned on, respectively, for protection of the transistor 44 by reducing to zero volts its corresponding source-drain voltage (V_SD=0) and gate-source voltage (V_GS=0). Further, the N-well of the transistor 44 also is at 3.3V. In addition, setting the control signal P2 to zero volts (P2=0) turns off transistor 68, causing isolation of nodes 24 and 26, thereby protecting transistors 48 and 50 from the 3.3V on node 24.

Low Voltage Mode

As illustrated in FIG. 3, the controller 20 in low voltage mode is configured for setting the voltage selection signal (V_SEL) to a value that causes the voltage selection circuit 70 to set VDD at the lower voltage of 1.5V (VDD=1.5V). In addition, the controller 20 outputs the control signal P1 to 1.5V to turn off the transistor 66; the controller 20 also outputs the control signals N1, N2 and P2 for 3.3V (N1=N2=P2=3.3V). The controller supplies data on the control signals D1 and D2 to the respective low-voltage based CMOS inverters 102 and 100. Note that in low voltage mode the controller 20 outputs the same values for control signals D1 and D2.

Hence, the transistors 56 and 58 are turned on in response to inputs N1 and N2, respectively as closed low resistance switches. The slew rate of the output signal V_OUT on the pad 74 is a function of the gate voltages G1 and G2 on the low-voltage pull-up transistor 44 and the low-voltage pull-down transistor 46, respectively. In addition, the transistors 56 and 58 add switching capacitance to the pad node 74 due to the need to charge/discharge the capacitance associated with transistors 56 and 58, reducing the slew rate of the output signal V_OUT on its rising and falling edges.

In addition, the falling slew rate of the output signal V_OUT is controlled by the gate voltage G2 on node 22 that is supplied to the transistor 46. The node 22 is connected to 1.5 V via the transistor 62 and the current source 78. The transistors 62 and 64 are configured as an inverter: the value D2=0 causes the transistor 62 to turn on and supply current from the current source 78 to the node 22. The current source 78 is configured for limiting the rate in which the voltage on node 22 can rise, such that the voltage rise on node 22 is a function of the current source 78: a higher/lower current output by the current source 78 results in a faster/slower fall time in the output signal V_OUT.

Similarly, the rising slew rate of the output signal V_OUT is controlled by the gate voltage G1 on node 24 that is supplied to the transistor 44. In low-voltage mode the transistor 68 is turned on (P2=3.3V) and transistors 52 and 54 are turned off. The gate voltage of transistor 44 is controlled by transistors 48 and 50: the value D1=1 causes the transistor 50 to turn on and causes the current source 76 to limit the draw of current from the node 24. Hence, the current source 76 is configured for limiting the rate in which the voltage on node 24 can fall for charging the gate capacitance of the transistor 44, such that the voltage fall on node 24 is a function of the current source 76: a higher/lower current output by the current source 76 results in a faster/slower rise time in the output signal V_OUT.

To minimize crowbar current (i.e., the current flowing through the output stack of transistors 44, 56, 58, and 46) due to the transistors 44 and 46 being ON at the same time during a transition from "1" to "0" or vice versa, the disclosed embodiment ensures that the transistors 44 and 46 are turned off more quickly than they can be turned on. In particular, the pull-down transistor 46 is quickly turned off by transistor 64, which is coupled to VSS (ground): transistor 64 has no current limiter, and therefore can quickly discharge node 22, enabling transistor 46 to be quickly turned off. Similarly, transistor 44 can be turned off quickly by transistor 48 turning on quickly, since there is no current limiter between the transistor 48 and the 1.5V voltage supply. Hence, the transistor 48 can quickly discharge node 24 to 1.5V (VDD in low voltage mode).

In contrast, the current sources 76 and 78 limit the current that can pass through transistors 50 and 62, respectively, causing respective transistors 44 and 46 to turn on at a much slower rate than the turn-off rate; hence, the current flowing through transistors 48 and 64 is greater than the current that can flow through their respective complementary transistors 50 and 62 by a factor of 10:1 (i.e., the current through transistors 48 and 64 is up to ten times greater than the current flowing through the respective complementary transistors 50 and 62). Hence, crowbar current is avoided by pull-up transistor 44 turning on much slower than pull-down transistor 46 is turned on, and conversely by pull-up transistor 44 turning off much faster than pull-down transistor 46 is turned off.

The current sources 76 and 78 are calibrated to compensate for variations due to process technology, voltage, or temperature that would change the strength (e.g., gain based on drain current $I_D$ relative to the voltage across the source and drain $V_{DS}$, or determining saturation current $I_{D\text{-}SAT}$) of the transistors of the driver 40, and particularly transistors 44 and 46. For example if the manufacturing process resulted in the transistors 44 and 46 being characterized as being "strong" (e.g., large gain), then the current sources 76 and 78 would tend to be configured to provide less current; if the manufacturing process resulted in the transistors 44 and 46 being characterized as being "weak" (e.g., a smaller gain), then the current sources 76 and 78 would tend to be configured to provide more current.

While this invention has been described with what is presently considered to be the most practical preferred embodiment, it is to be understood that the invention is not limited to the disclosed embodiments, but, on the contrary, is intended to cover various modifications and equivalent arrangements included within the spirit and scope of the appended claims.

What is claimed is:

1. An integrated circuit comprising:
   a controller configured for outputting configuration signals for one of a first voltage mode and a second voltage mode, the first voltage mode corresponding to outputting an output signal at a first voltage range and a first frequency, the second voltage mode corresponding to outputting the output signal at a second voltage range and a second frequency, the first voltage range greater than the second voltage range and the second frequency substantially higher than the first frequency; and
   a dual mode output driver configured for selectively outputting the output signal at one of the first voltage mode and the second voltage mode in response to the configuration signals, the dual mode output driver including:
   a voltage source configured for outputting one of a first reference voltage for the first voltage range and a second reference voltage for the second voltage range in response to a first of the configuration signals,
   a high-voltage pull-up transistor coupled to the voltage source and an output node for the output signal, the high-voltage pull-up transistor configured for controlling a voltage rise of the output signal according to the first voltage mode in response to a second of the configuration signals,
   a high-voltage pull-down transistor coupled to the output node and configured for controlling a voltage drop of the output signal according to the first voltage range in response to a third of the configuration signals,
   a low-voltage pull-up transistor, coupled to the voltage source, and configured for controlling a voltage rise of the output signal according to the second voltage mode in response to a first gate signal generated based on a fourth of the configuration signals,
   a low-voltage pull-down transistor, coupled to a base reference voltage and the high-voltage pull-down transistor at a connecting node, and configured for controlling a voltage drop of the output signal according to the second voltage mode in response to a second gate signal generated based on a fifth of the configuration signals, and protection circuitry configured for protecting the low-voltage pull-up transistor and the low-voltage pull-down transistor from encountering an overvoltage condition during operation of the dual mode output driver in the first voltage mode.

2. The integrated circuit of claim 1, wherein the protection circuitry includes:
   a third high-voltage transistor configured for isolating the low-voltage pull-up transistor from the output node in response to a sixth of the configuration signals being deasserted by the controller for the first voltage mode; and
   a first low-voltage based CMOS inverter configured for asserting the second gate signal at the second reference voltage in response to the fifth of the configuration signals being deasserted by the controller for the first voltage mode.

3. The integrated circuit of claim 2, wherein the protection circuitry further includes:
   a fourth high-voltage transistor coupled to the voltage source and configured for supplying the first reference voltage to a drain of the low-voltage pull-up transistor in response to the sixth of the configuration signals being deasserted, the source of the low-voltage pull-up transistor coupled to the voltage source; and
   a fifth high-voltage transistor coupled to the voltage source and configured for supplying the first reference voltage to a gate of the low-voltage pull-up transistor in response to the sixth of the configuration signals being deasserted.

4. The integrated circuit of claim 2, wherein the protection circuitry further includes:
   a second low-voltage based CMOS inverter configured for outputting the first gate signal, relative to the second voltage range, in response to the fourth of the configuration signals, the controller outputting the fourth and fifth configuration signals as equal-value data signals in the second voltage mode; and
   a fourth high-voltage transistor configured for isolating the second low-voltage based CMOS inverter from the gate of the low-voltage pull-up transistor in response to the deassertion of the sixth of the configuration signals by the controller for the first voltage mode.

5. The integrated circuit of claim 4, wherein:
   the first low-voltage based CMOS inverter includes a first pull-up transistor, a first pull-down transistor, and a first current source coupled between the second reference voltage and the first pull-up transistor, the first current source configured for controlling a voltage rise in the second gate signal for the control of the voltage drop of the output signal according to the second voltage mode; and
   the second low-voltage based CMOS inverter includes a second pull-up transistor, a second pull-down transistor, and a second current source coupled between the base reference voltage and the second pull-down transistor, the second current source configured for controlling a voltage drop in the first gate signal for the control of the voltage rise of the output signal according to the second voltage mode.

6. The integrated circuit of claim 5, wherein the first pull-down transistor is coupled to the base reference voltage and the second pull-up transistor is coupled to the second reference voltage, causing the respective low-voltage pull-down transistor and the low-voltage pull-up transistor to be turned off substantially faster than being turned on by the first pull-up transistor in series with the first current source and the second pull-down transistor in series with the second current source, respectively.

7. A method in an integrated circuit for outputting an output signal, the method comprising:
   providing a controller configured for outputting configuration signals for one of a first voltage mode and a second voltage mode, the first voltage mode corresponding to outputting the output signal at a first voltage range and a first frequency, the second voltage mode corresponding to outputting the output signal at a second voltage range and a second frequency, the first voltage range greater than the second voltage range and the second frequency substantially higher than the first frequency;
   providing a dual mode output driver configured for selectively outputting the output signal at one of the first voltage mode and the second voltage mode in response to the configuration signals, including:
   outputting by a voltage source configured in the dual mode output driver one of a first reference voltage for the first voltage range and a second reference voltage for the second voltage range in response to a first of the configuration signals,
   selectively controlling a voltage rise of the output signal, during the first voltage mode in response to a second of the configuration signals, by a high-voltage pull-up transistor in the dual mode output driver and that is coupled to the voltage source and an output node for the output signal,
   selectively controlling a voltage drop of the output signal, during the first voltage mode and according to the first voltage range in response to a third of the configuration signals, by a high-voltage pull-down transistor in the dual mode output driver and coupled to the output node,
   selectively controlling a voltage rise of the output signal, during the second voltage mode in response to a first gate signal generated based on a fourth of the configuration signals, by a low-voltage pull-up transistor in the dual mode output driver and coupled to the voltage source,
   selectively controlling a voltage drop of the output signal, during the second voltage mode and according to the second voltage mode in response to a second gate signal generated based on a fifth of the configuration signals, by a low-voltage pull-down transistor in the dual mode output driver and coupled to a base reference voltage and the high-voltage pull-down transistor at a connecting node, and
   providing protection circuitry configured for protecting the low-voltage pull-up transistor and the low-voltage pull-down transistor from encountering an overvoltage condition during operation of the dual mode output driver in the first voltage mode.

8. The method of claim 7, wherein the step of providing protection circuitry includes:
   providing a third high-voltage transistor configured for isolating the low-voltage pull-up transistor from the output node in response to a sixth of the configuration signals being deasserted by the controller for the first voltage mode; and
   providing a first low-voltage based CMOS inverter configured for asserting the second gate signal at the second reference voltage in response to the fifth of the configuration signals being deasserted by the controller for the first voltage mode.

9. The method of claim 8, wherein the step of providing protection circuitry further includes:
  providing a fourth high-voltage transistor coupled to the voltage source and configured for supplying the first reference voltage to a drain of the low-voltage pull-up transistor in response to the sixth of the configuration signals being deasserted, the source of the low-voltage pull-up transistor coupled to the voltage source; and
  providing a fifth high-voltage transistor coupled to the voltage source and configured for supplying the first reference voltage to a gate of the low-voltage pull-up transistor in response to the sixth of the configuration signals being deasserted.

10. The method of claim 8, wherein the step of providing protection circuitry further includes:
  providing a second low-voltage based CMOS inverter configured for outputting the first gate signal, relative to the second voltage range, in response to the fourth of the configuration signals, the controller outputting the fourth and fifth configuration signals as equal-value data signals in the second voltage mode; and
  providing a fourth high-voltage transistor configured for isolating the second low-voltage based CMOS inverter from the gate of the low-voltage pull-up transistor in response to the deassertion of the sixth of the configuration signals by the controller for the first voltage mode.

11. The method of claim 10, wherein:
  the first low-voltage based CMOS inverter includes a first pull-up transistor, a first pull-down transistor, and a first current source coupled between the second reference voltage and the first pull-up transistor, the first current source configured for controlling a voltage rise in the second gate signal for the control of the voltage drop of the output signal according to the second voltage mode; and
  the second low-voltage based CMOS inverter includes a second pull-up transistor, a second pull-down transistor, and a second current source coupled between the base reference voltage and the second pull-down transistor, the second current source configured for controlling a voltage drop in the first gate signal for the control of the voltage rise of the output signal according to the second voltage mode.

12. The method of claim 11, wherein the first pull-down transistor is coupled to the base reference voltage and the second pull-up transistor is coupled to the second reference voltage, causing the respective low-voltage pull-down transistor and the low-voltage pull-up transistor to be turned off substantially faster than being turned on by the first pull-up transistor in series with the first current source and the second pull-down transistor in series with the second current source, respectively.

* * * * *